United States Patent
Mimotogi et al.

(10) Patent No.: US 7,336,341 B2
(45) Date of Patent: Feb. 26, 2008

(54) SIMULATOR OF LITHOGRAPHY TOOL FOR CORRECTING FOCUS ERROR AND CRITICAL DIMENSION, SIMULATION METHOD FOR CORRECTING FOCUS ERROR AND CRITICAL DIMENSION, AND COMPUTER MEDIUM FOR STORING COMPUTER PROGRAM FOR SIMULATOR

(75) Inventors: Shoji Mimotogi, Yokohama (JP); Daisuke Kawamura, Yokohama (JP); Akiko Yamada, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 348 days.

(21) Appl. No.: 11/045,296

(22) Filed: Jan. 31, 2005

(65) Prior Publication Data

US 2005/0183056 A1 Aug. 18, 2005

(30) Foreign Application Priority Data

Feb. 2, 2004 (JP) .......................... P2004-025928

(51) Int. Cl.
*G03B 27/68* (2006.01)
(52) U.S. Cl. .......................................... 355/52; 355/55
(58) Field of Classification Search ............... 355/52, 355/55, 53; 438/975
See application file for complete search history.

(56) References Cited

U.S. PATENT DOCUMENTS

| | | | | |
|---|---|---|---|---|
| 5,883,704 A | * | 3/1999 | Nishi et al. | 355/67 |
| 6,784,005 B2 | * | 8/2004 | Lin et al. | 438/16 |
| 2002/0149755 A1 | * | 10/2002 | Okita et al. | 355/53 |

FOREIGN PATENT DOCUMENTS

| JP | 06-176997 | 6/1994 |
|---|---|---|
| JP | 08-148404 | 6/1996 |

* cited by examiner

*Primary Examiner*—Diane I. Lee
*Assistant Examiner*—Chia-how Michael Liu
(74) *Attorney, Agent, or Firm*—Finnegan, Henderson, Farabow, Garrett & Dunner, L.L.P.

(57) ABSTRACT

A simulator of a lithography tool includes a correcting parameter memory storing a correcting scaling value to correct a focus error of a projection optical system in the lithography tool and a correcting bias to correct a critical dimension error generated in the lithography tool. A model simulation engine simulates an image formation under a corrected focus calculated by multiplying a defocus of the projection optical system by the correcting scaling value to model a calculated critical dimension of an image. A bias corrector adds the correcting bias to the calculated critical dimension to correct the image.

20 Claims, 5 Drawing Sheets

SIMULATOR OF LITHOGRAPHY TOOL FOR CORRECTING FOCUS ERROR AND CRITICAL DIMENSION, SIMULATION METHOD FOR CORRECTING FOCUS ERROR AND CRITICAL DIMENSION, AND COMPUTER MEDIUM FOR STORING COMPUTER PROGRAM FOR SIMULATOR

CROSS REFERENCE TO RELATED APPLICATIONS AND INCORPORATION BY REFERENCE

This application is based upon and claims the benefit of priority from prior Japanese Patent Application P2004-25928 filed on Feb. 2, 2004; the entire contents of which are incorporated by reference herein.

BACKGROUND OF THE INVENTION

1. Field of the Invention

The present invention relates to photo lithography simulation techniques for predicting projected images precisely and in particular to a simulator of a lithography tool, a simulation method, and a computer program product for the simulator.

2. Description of the Related Art

As the semiconductor industry moves into a deep submicron range, costs associated with wafer processing are increasing rapidly. Therefore, repeating the wafer processing for optimizing processing conditions does not comply with a manufacturing cost. Hence, a lithography simulation that provides information for optimizing the wafer processing is required, However, identifying all parameters of an actual environment for lithography simulation is difficult. Japanese Patent Laid Open Publication No. Hei8-148404 discloses a simulation method modeling an exposure environment. But, it is still difficult to match the lithography simulation to actually obtained profiles even though the exposure environment is modeled. Accuracy of the lithography simulation is not sufficient, especially in a focus direction of a projection system. Recently, the numerical aperture (NA) of the projection system is increased to shrink the size of a semiconductor device. However, the higher the NA, the narrower a depth of focus (DOF). Therefore, a lithography simulation provides accurate information in the focus direction has been requested.

SUMMARY OF THE INVENTION

An aspect of present invention inheres in a simulator of a lithography tool according to an embodiment of the present invention. The simulator has a correcting parameter memory configured to store a correcting scaling value and a correcting bias, the correcting scaling value being used to correct a focus error of a projection optical system in the lithography tool, the correcting bias being used to correct a critical dimension error generated in the lithography tool, a model simulation engine configured to simulate an image formation by the lithography tool under a corrected focus to model a calculated critical dimension of an image, the corrected focus being calculated by multiplying a defocus of the projection optical system by the correcting scaling value, and a bias corrector configured to add the correcting bias to the calculated critical dimension to correct the image.

Another aspect of the present invention inheres in a simulation method according to the embodiment of the present invention. The method includes obtaining a correcting scaling value used to correct a focus error of a projection optical system in a lithography tool, obtaining a correcting bias used to correct a critical dimension error generated in the lithography tool, simulating an image formation by the lithography tool under a corrected focus to model a calculated critical dimension of an image, the corrected focus being calculated by multiplying a defocus of the projection optical system by the correcting scaling value, and adding the correcting bias to the calculated critical dimension to correct the image.

Yet another aspect of the present invention inheres in a computer program product for the simulator according to the embodiment of the present invention. The computer program product includes instructions configured to obtain a correcting scaling value used to correct a focus error of a projection optical system in a lithography tool within the simulator, instructions configured to obtain a correcting bias used to correct a critical dimension error generated in the lithography tool within the simulator, instructions configured to simulate an image formation by the lithography tool under a corrected focus to model a calculated critical dimension of an image, the corrected focus being calculated by multiplying a defocus of the projection optical system by the correcting scaling value within the simulator, and instructions configured to add the correcting bias to the calculated critical dimension to correct the image within the simulator.

DETAILED DESCRIPTION OF THE INVENTION

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Figure 1:
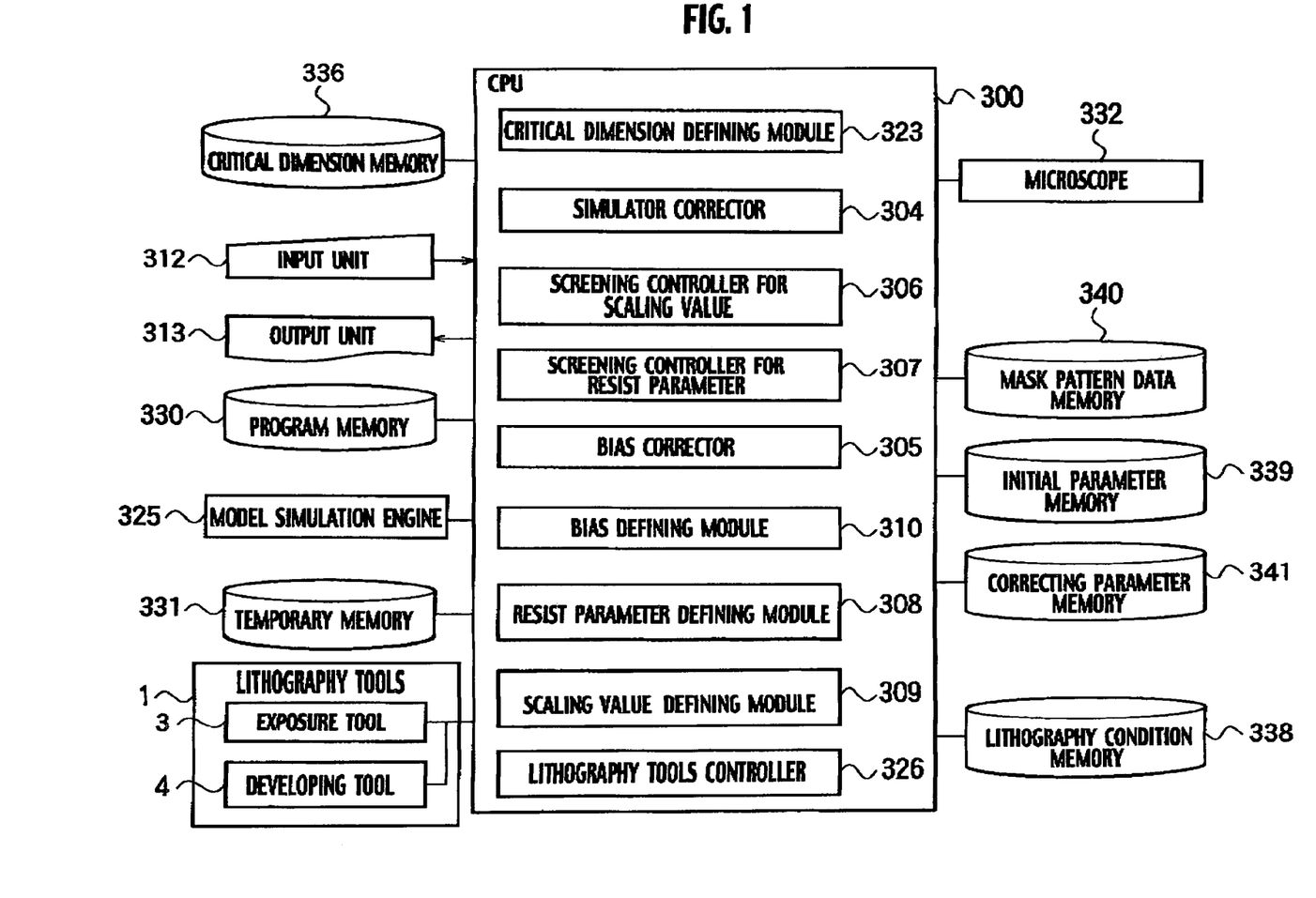
FIG. 1 is a diagram of a simulator in accordance with an embodiment of the present invention.
Figure 2:
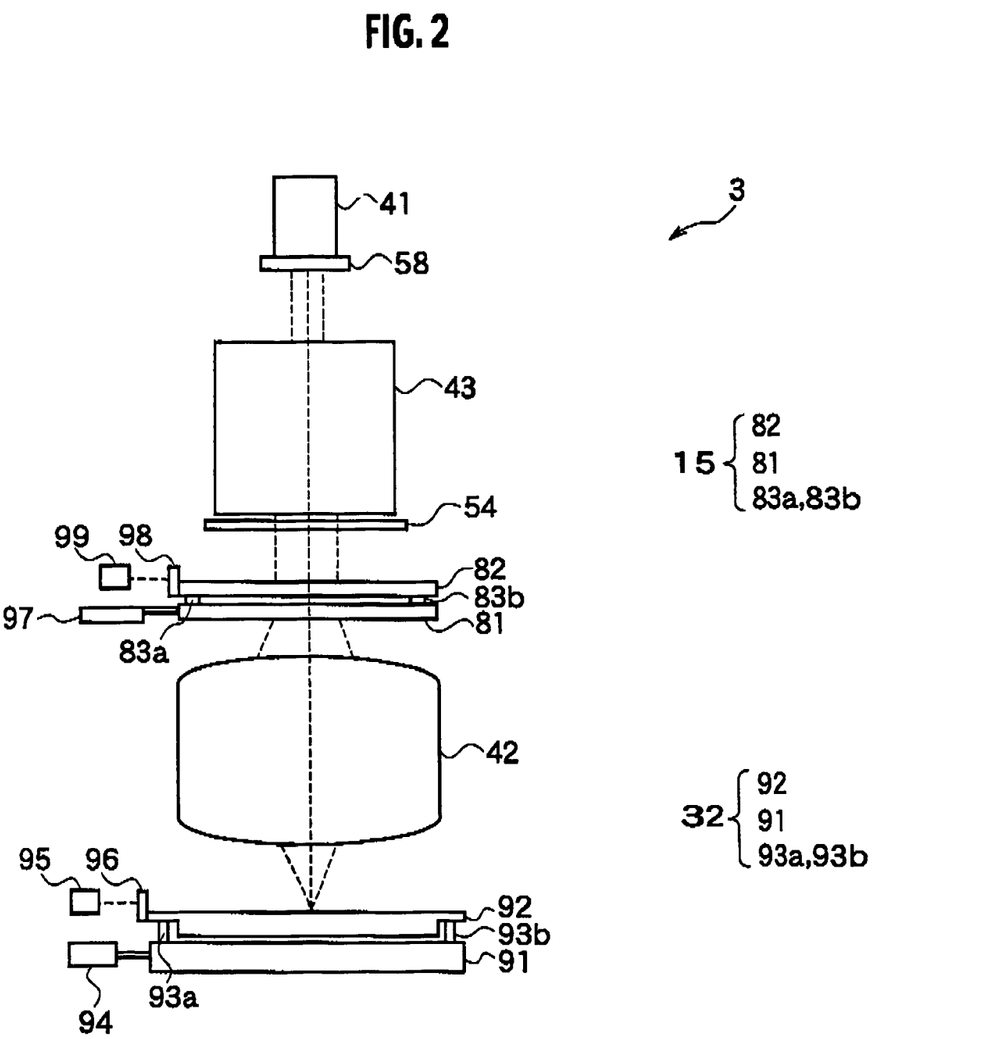
FIG. 2 illustrates an exposure tool in accordance with the embodiment of the present invention.

With reference now to FIG. 1, a simulator of lithography tools 1 includes a central processing unit (CPU) 300 and a correcting parameter memory 341 connected to the CPU 300. The lithography tools 1 include an exposure tool 3 and a developing tool 4. The correcting parameter memory 341 is configured to store a correcting scaling value and a correcting bias. With reference to FIG. 2, the "correcting scaling value" is used to correct a focus error of a projection optical system 42 in the exposure tool 3. The "correcting bias" is used to correct a critical dimension error generated in the lithography tools 1. Here, the "critical dimension" is the distance between line-space boundaries at a given cross section of a feature such as a line width.

With reference again to FIG. 1, the CPU 300 further includes a model simulation engine 325 configured to simulate an image formation by the lithography tools 1 under a corrected focus to model a calculated critical dimension of an image. The corrected focus is calculated by multiplying a defocus of the projection optical system 42 shown in FIG. 2 by the correcting scaling value. A bias corrector 305 is configured to add the correcting bias to the calculated critical dimension to correct the image.

With reference again to FIG. 2, the exposure tool 3 includes a light source 41 emitting a light, an aperture diaphragm holder 58 disposed under the light source 41, an illuminator 43 condensing the light emitted from the light source 41, a slit holder 54 disposed under the illuminator 43, a reticle stage 15 disposed beneath the slit holder 54, a projection optical system 42 disposed beneath the reticle stage 15, and a wafer stage 32 disposed beneath the projection optical system 42.

The reticle stage 15 includes a reticle XY stage 81, shafts 83a, 83b provided on the reticle XY stage 81, and a reticle tilting stage 82 attached to the reticle XY stage 81 through the shafts 83a, 83b. The reticle stage 15 is attached to a reticle stage aligner 97. The reticle stage aligner 97 aligns the position of the reticle XY stage 81. Each of the shafts 83a, 83b extends from the reticle XY stage 81. Therefore, the position of the reticle tilting stage 82 is determined by the reticle XY stage 81. The tilt angle of the reticle tilting stage 82 is determined by the shafts 83a, 83b. Further, a reticle stage mirror 98 is attached to the edge of the reticle tilting stage 82. The position of the reticle tilting stage 82 is monitored by an interferometer 99 disposed opposite the reticle stage mirror 98.

The wafer stage 32 includes a wafer XY stage 91, shafts 93a, 93b provided on the wafer XY stage 91, and a wafer tilting stage 92 attached to the wafer XY stage 91 through the shafts 93a, 93b. The wafer stage 32 is attached to a wafer stage aligner 94. The wafer stage aligner 94 aligns the position of the wafer XY stage 91. Each of the shafts 93a, 93b extends from the wafer XY stage 91. Therefore, the position of the wafer tilting stage 92 is determined by the wafer XY stage 91. The tilt angle of the wafer tilting stage 92 is determined by the shafts 93a, 93b. Further, a wafer stage mirror 96 is attached to the edge of the wafer tilting stage 92. The position of the wafer tilting stage 92 is monitored by an interferometer 95 disposed opposite the wafer stage mirror 96.

With reference again to FIG. 1, the developing tool 4 is configured to develop a resist exposed to light. Developing conditions of the developing tool 4 are controllable. The developing conditions include concentration of a developer solution, a solution temperature, and a developing time. A microscope 332 is also connected to the CPU 300. An atomic force microscope (AFM) and a scanning electron microscope (SEN) can be used for the microscope 332. The microscope 332 is configured to measure an actual critical dimension of the image formed by the lithography tools 1.

Further, the CPU 300 includes a lithography tools controller 326; a critical dimension defining module 323, a screening controller for resist parameter 307, a resist parameter defining module 308, a screening controller for scaling value 306, a scaling value defining module 309, a bias defining module 310, and a bias corrector 305. Also, a mask pattern data memory 340, a lithography condition memory 330, a critical dimension memory 336, a model simulation engine 325, and an initial parameter memory 339 are connected to the CPU 300.

The lithography tools controller 326 controls the exposure conditions of the exposure tool 3. For example, the lithography tools controller 326 instructs the reticle stage aligner 97 shown in FIG. 2 and the wafer stage aligner 94 to shift and tilt the reticle stage 15 and the wafer stage 32. The lithography tools controller 326 also monitors the orientation, the shift direction, and the shift speed of the reticle stage 15 and the wafer stage 32 by using the interferometer 99 and the interferometer 95. Also, the lithography tools controller 326 shown in FIG. 1 adjusts the developing conditions of the developing tool 4.

The mask pattern data memory 340 stores design data of a mask pattern for testing and a mask pattern for manufacturing a semiconductor device such as CAD data. The mask pattern for testing is prepared for a testing mask mounted on the reticle stage 15 shown in FIG. 2. Also, the mask pattern for manufacturing the semiconductor device is prepared for a mask for manufacturing the semiconductor device mounted on the reticle stage 15 shown in FIG. 2.

Figure 3:
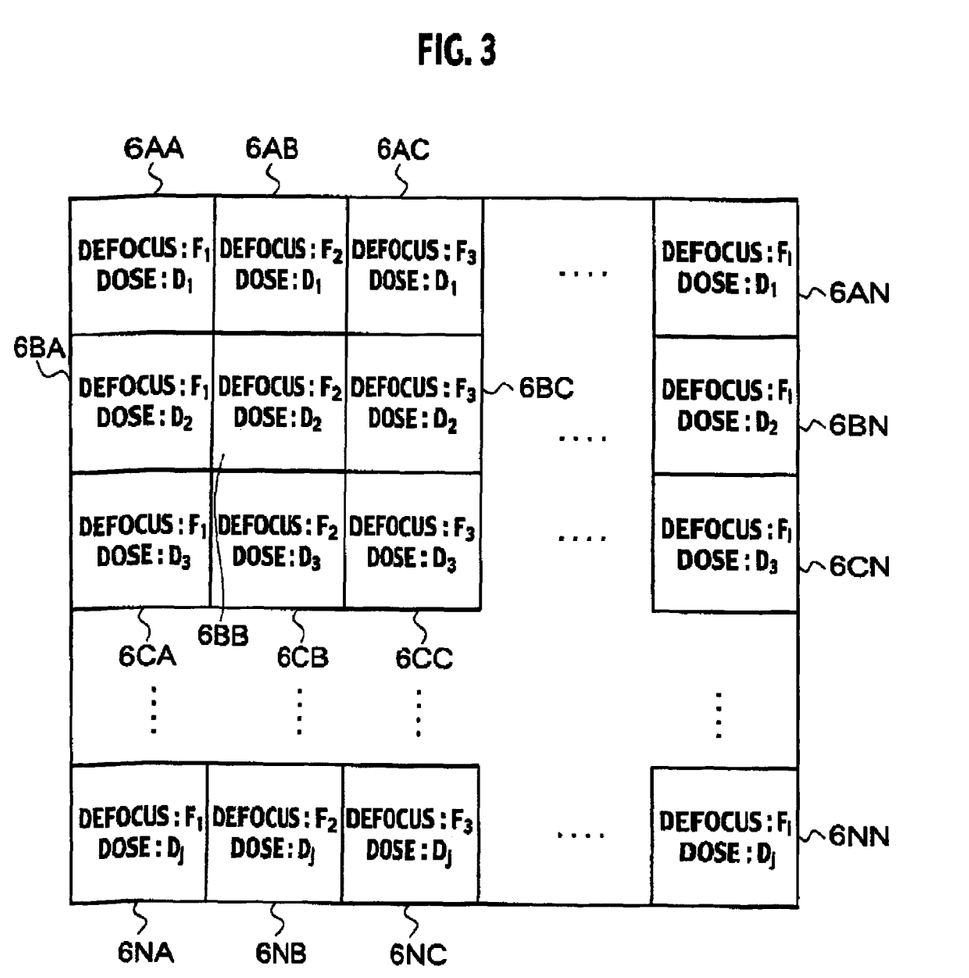
FIG. 3 is a sample matrix of exposure condition in accordance with the embodiment of the present invention.

With reference to FIG. 3, the lithography condition memory 336 shown in FIG. 1 stores defocus and dose conditions 6AA, 6AB, 6AC, . . . , 6AN, 6BA, 6BB, 6BC, . . . , 6BN, 6CA, 6CB, 6CC, . . . , 6CN, 6NA, 6NB 6NC, . . . , 6NN for step and scan processes by the exposure tool 3. In each of the defocus and dose conditions 6AA-6NN, a defocus "$F_i$" (i=1, 2, 3, . . . ) and a dose "$D_j$" (J=1, 2, 3, . . . ) for projecting the mask pattern for testing or the mask pattern for manufacturing the semiconductor device onto the resist are defined. Here, "defocus" means a perpendicular distance between a focal point of the projection optical system 42 and a top of the resist coated on a substrate mounted on the wafer stage 32 of the exposure tool 3. Further, the lithography condition memory 338 shown in FIG. 1 stores a plurality of exposure conditions, such as the numerical aperture (NA) of the projection optical system 42 shown in FIG. 2, a coherence factor "σ", an aperture type for annular or quadrupolar illumination, and the developing condition for the developing tool 4.

With reference again to FIG. 1, the critical dimension defining module 323 obtains actual critical dimensions of the image of the projected mask pattern for testing measured by the microscope 332. The critical dimension defining module 323 defines each of the actual critical dimensions of the image formed under the defocus "$F_i$" and the dose "$D_j$" conditions as an actual critical dimension "$CD_{ij}$". The critical dimensions memory 336 stores the actual critical dimension "$CD_{ij}$" defined by the critical dimension defining module 323.

The model simulation engine 325 simulates a projection of the mask pattern for testing or the mask pattern for manufacturing the semiconductor device onto the resist by the exposure tool 3. The model simulation engine 325 may employ a Fourier transform to calculate the light intensity of the image of the projected mask pattern and a string model to calculate the critical dimension of the projected mask pattern in the developed resist. The model simulation engine 325 simulates the projection of the mask pattern onto the resist under various exposure and developing onto the resist under various exposure and developing conditions to model the critical dimension of the image.

The initial parameter memory 339 stores a table of scaling value "s", a bias variable "b", and a plurality of resist parameters. Here, the scaling value "s" is each of a plurality of terms, in which each term is derived from the preceding term by adding the common difference. For example, the scaling value "s" has the general form 0.99+(n−1)*0.00001, and the maximum value of the scaling value "s" is 1.001. Each of the resist parameters is a combination of a resist material, the thickness of the resist, a developer solution type, the concentration of the developer solution, the developing time, and a developing rate, for example.

The screening controller for resist parameter 307 transfers the mask pattern for testing stored in the mask pattern data memory 340, the defocus and dose conditions 6AA-6NN shown in FIG. 3 and stored in the lithography condition memory 338 shown in FIG. 1, the resist parameters stored in the initial parameter memory 339, and the exposure conditions such as the NA of the projection optical system 42 shown in FIG. 2, the coherence factor "σ", and the aperture type for annular or quadrupolar illumination stored in the lithography condition memory 338 to the model simulation engine 325. Further, the screening controller for resist parameter 307 instructs the model simulation engine 325 to simulate the projection of the mask pattern for testing onto the resist under each of the defocus and dose conditions 6AA-6NN and develops the resist by using the plural resist parameters to model a plurality of resist parameter dependency critical dimensions "$W_{ij}$" of the image of the projected mask pattern for testing.

The resist parameter defining module 308 samples the best resist parameter dependency critical dimension approximate to the actual critical dimension "$CD_{ij}$" from the plural resist parameter dependency critical dimensions "$W_{ij}$". Further, the resist parameter defining module 308 defines a resist parameter used to model the best resist parameter dependency critical dimension as a correcting resist parameter.

For example, the resist parameter defining module 308 calculates a residual sum of squares "$U_r$" of the actual critical dimension "$CD_{ij}$" stored in the critical dimension memory 336 and each of the plural resist parameter dependency critical dimensions "$W_{ij}$" calculated by the model simulation engine 325. The residual sum of squares "$U_r$" is given by equation (1).

$$U_r = \sum_{ij} (CD_{ij} - W_{ij})^2 \quad (1)$$

Further, the resist parameter defining module 308 determines the minimum residual sum of squares "$U_r$" from a plurality of residual sum of squares "$U_r$" corresponded to the plural resist parameters. The resist parameter defining module 308 defines the resist parameter giving the minimum residual sum of squares "$U_r$" as the correcting resist parameter and stores the correcting resist parameter in the correcting parameter memory 341.

The screening controller for scaling value 306 obtains the plural scaling values "s" stored in the initial parameter memory 339 and the correcting resist parameter stored in the correcting parameter memory 341. Further, the screening controller for scaling value 306 multiplies each defocus "$F_i$" contained in the defocus and dose conditions 6AA-6NN by each of the plurality of scaling values "s" to calculate a plurality of correcting defocuses "$FC_i$". The screening controller for scaling value 306 transfers the plurality of correcting defocuses "$FC_i$" and the correcting resist parameter to the model simulation engine 325. The screening controller for scaling value 306 instructs the model simulation engine 325 to simulate the projection of the mask pattern for testing onto the resist under each of the correcting defocuses "$FC_i$" and develops the resist by using the corrected resist parameter to model a plurality of focus dependency critical dimensions "$Ws_{ij}$" of the image of the projected mask testing pattern. Further, the screening controller for scaling value 306 transfers the focus dependency critical dimensions "$Ws_{ij}$" to the scaling value defining module 309.

The scaling value defining module 309 samples the best focus dependency critical dimension "$Ws_{ij}$" approximate to the actual critical dimension "$CD_{ij}$" from among the plurality of focus dependency critical dimensions "$Ws_{ij}$". Further, the scaling value defining module 309 defines a scaling value "s" used for calculating the best focus dependency critical dimension "$Ws_{ij}$" as the correcting scaling value "$s_B$".

For example, the scaling value defining module 309 calculates a residual sum of squares "Us" of the actual critical dimension "$CD_{ij}$" stored in the critical dimension memory 336 and each of the focus dependency critical dimensions "$Ws_{ij}$" corresponding to each of the scaling values "s". The residual sum of squares "Us" is given by equation (2).

$$Us = \sum_{ij} (CD_{ij} - Ws_{ij})^2 \quad (2)$$

Further, the scaling value defining module 309 determines the minimum residual sum of squares "Us" from the plurality of residual sum of squares "Us" corresponding to the plurality of scaling values "s". The scaling value defining module 309 defines a scaling value "s" used for calculating the minimum residual sum of squares "Us" as the correcting scaling value "$s_B$". The scaling value defining module 309 stores the correcting scaling value "$s_B$" in the correcting parameter memory 341.

The bias defining module 310 obtains the bias variable "b" stored in the initial parameter memory 339 and defines a critical dimension bias function "$W(b)_{ij}$" expressed by the sum of the focus dependency critical dimension "$Ws_{ij}$" and the bias variable "b".

Further, the bias defining module 310 calculates a residual sum of squares "U(b)" of the actual critical dimension "$CD_{ij}$" stored in the critical dimension memory 336 and the critical dimension bias function "$W(b)_{ij}$". The residual sum of squares "U(b)" is given by equation (3).

$$U(b) = \sum_{ij} (CD_{ij} - W(b)_{ij})^2 \quad (3)$$

The bias defining module 310 differentiates the residual sum of squares "U(b)" for obtaining a bias variable "b" that gives the minimum of the residual sum of squares "U(b)". The bias defining module 310 defines the bias variable "b" that gives the minimum of the residual sum of squares "U(b)" as the correcting bias "$b_B$" used to correct the critical dimension error generated in the lithography tool 1 and stores the correcting bias "$b_B$" in the correcting parameter memory 341.

The simulator corrector 304 multiplies the defocus "$F_i$" contained in each of the defocus and dose conditions 6AA-6NN shown in FIG. 3 by the correcting scaling value "$s_B$" to calculate a correcting defocus "$FC_i$". The simulator corrector 304 instructs the model simulation engine 325 to simulate the projection of the mask pattern for manufacturing the semiconductor device onto the resist under the correcting defocus "$FC_i$" to model the calculated critical dimension of the image of the projected mask pattern for manufacturing the semiconductor device. The bias corrector 305 corrects the image by adding the correcting bias "$b_s$"

stored in the correcting parameter memory 341 to the calculated critical dimension modeled by the model simulation engine 325.

With reference again to FIG. 1, an input unit 312, an output unit 313, a program memory 330, and a temporary memory 331 are also connected to the CPU 300. A keyboard and a mouse maybe used for the input unit 312. An LCD or an LED maybe used for the output unit 313. The program memory 330 stores a program instructing the CPU 300 to transfer data with apparatuses connected to the CPU 300. The temporary memory 331 stores temporary data calculated during operation of the CPU 300.

Figure 4:
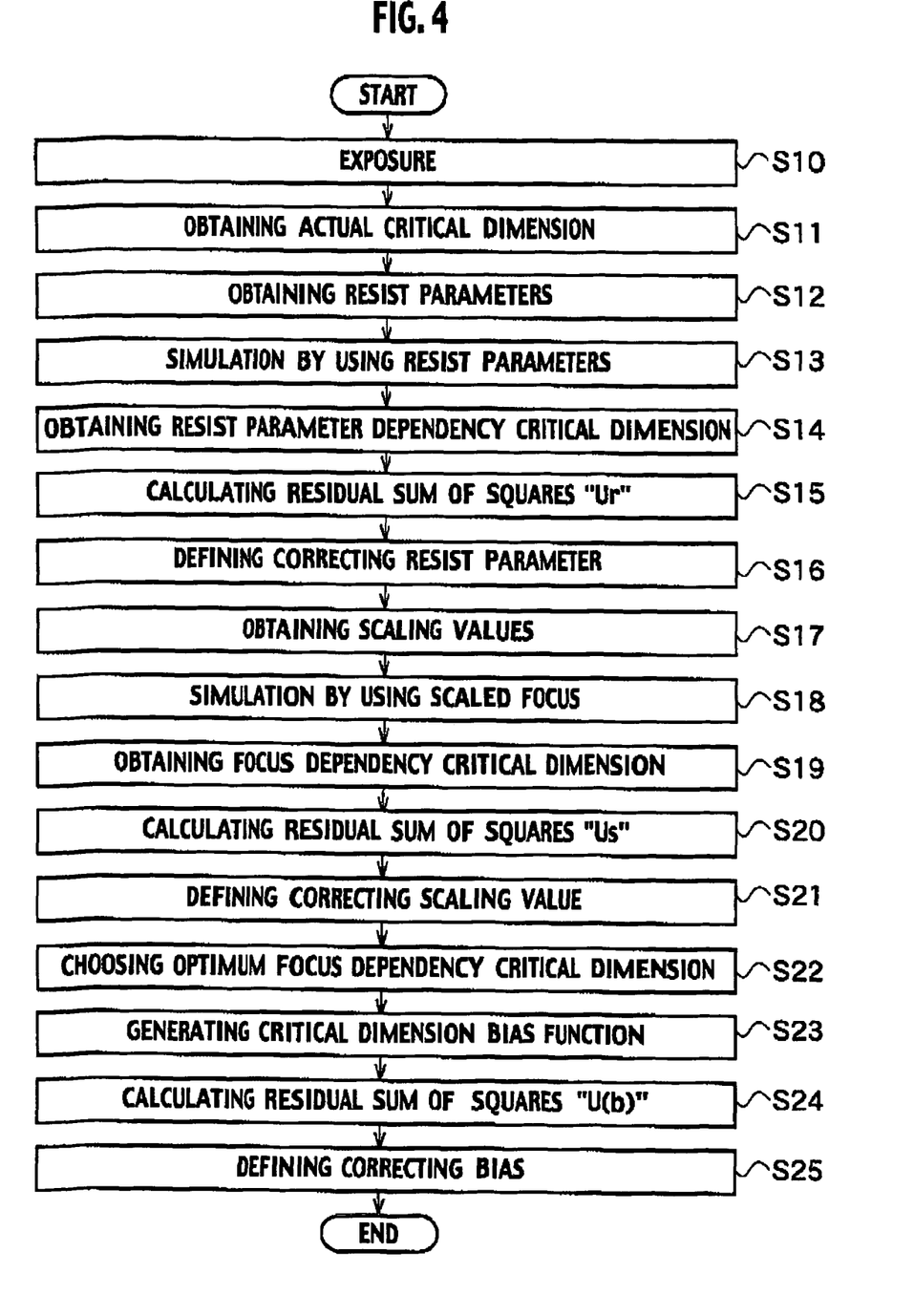
FIG. 4 is a flowchart depicting a parameter tuning method in accordance with the embodiment of the present invention.

With reference next to FIG. 4, a parameter tuning method for obtaining the correcting resist parameter, the correcting scaling value "$s_B$", and the correcting bias "$b_B$" is described.

In step 910, the testing mask is mounted on the reticle tilting stage 82 of the exposure tool 3 shown in FIG. 2. The testing mask has a plurality of parallel rectangle transparent patterns, for example. If necessary, the aperture diaphragm is inserted in the aperture diaphragm holder 58 and the slit is inserted in the slit holder 54. There after, the lithography tools controller 326 shown in FIG. 1 reads the defocus and dose conditions 6AA-6NN shown in FIG. 3, respectively stored in the lithography condition memory 338 shown in FIG. 1. The lithography tools controller 326 instructs the reticle stage aligner 97 shown in FIG. 2 and the wafer stage aligner 94 to shift and tilt the reticle stage 115 and the wafer stage 32 to set each of the defocus and dose conditions 6AA-6NN in the exposure tool 3. The exposure tool 3 projects the mask pattern for testing onto the resist under each of the defocus and dose conditions 6AA-6NN.

In step S11, the resist exposed to the light under each of the defocus and dose conditions 6AA-6NN is developed by using the developing tool 4. Each of the actual critical dimensions of the images is measured by the microscope 332. Each of the actual critical dimensions of the images is transferred to the critical dimension defining module 323 and the critical dimension defining module 323 defines the actual critical dimension "$CD_{ij}$". Also, the critical dimension defining module 323 stores the actual critical dimension "$CD_{ij}$" in the critical dimension memory 336.

In step S12, the screening controller for resist parameter 307 transfers the plurality of resist parameters stored in the initial parameter memory 339, design data of the mask pattern for testing used in the step S10 and stored in the mask pattern data memory 340, and the exposure conditions such as the NA of the projection optical system 42 shown in FIG. 2, the coherence factor "σ", and the aperture type for annular or quadrupolar illumination stored in the lithography condition memory 338, to the model simulation engine 325.

In step S13, the screening controller for resist parameter 307 instructs the model simulation engine 325 to simulate the projection of the mask pattern for testing onto the resist under each of the defocus and dose conditions 6AA-6NN and develops the resist by using the plurality of resist parameters to model each of the resist parameter dependency critical dimensions "$W_{ij}$".

In step S14, the resist parameter defining module 308 shown in FIG. 1 obtains the resist parameter dependency critical dimensions "$W_{ij}$" modeled in the step S13. In step S15, the resist parameter defining module 308 calculates the residual sum of squares "$U_r$" given by the equation (1) by using the actual critical dimension "$CD_{ij}$" stored in the critical dimension memory 336 and each of the plurality of resist parameter dependency critical dimensions "$W_{ij}$".

In step S16, the resist parameter defining module 308 determines the minimum residual sum of squares "$U_r$" from the plurality of residual sum of squares "$U_r$". The resist parameter defining module 308 defines the resist parameters used for calculating the minimum residual sum of squares "$U_r$" as the correcting resist parameters and store the correcting resist parameters in the correcting parameter memory 341.

In step S17, the screening controller for scaling value 306 reads the plurality of scaling values "s" stored in the initial parameter memory 339 and the correcting resist parameters stored in the correcting resist parameters stored in the correcting parameter memory 341. Thereafter, the screening controller 306 for scaling values calculates the scaled focuses by using the scaling value "s" and transfers the scaled focuses into the model simulation engine 325.

In step S18, the model simulation engine 325 simulates the projection of the mask pattern for testing onto the resist under each of the scaled focuses to model each of the focus dependency critical dimensions "$Ws_{ij}$". In step S19, scaling value defining module 309 obtain the focus dependency critical dimensions "$Ws_{ij}$".

In step S20, the scaling value defining module 309 calculates the residual sum of squares "Us" by using the actual critical dimension "$CD_{ij}$" stored in the critical dimension memory 336 and each of the focus dependency critical dimensions "$Ws_{ij}$" corresponding to the plurality of scaling value "s".

In step S21, the scaling value defining module 309 defines the scaling value "s" giving the minimum residual sum of squares "Us" as the correcting scaling value "$s_B$". There after, the scaling value defining module 309 stores the correcting scaling value "$s_B$" in the correcting parameter memory 341. In step S22, the bias defining module 310 samples the best focus dependency critical dimension "$Ws_{ij}$" modeled by using the correcting scaling value "$s_B$".

In step S23 the bias defining module 310 reads the bias variable "b" stored in the initial parameter memory 339 and defines the sum of the best focus dependency critical dimension "$Ws_{ij}$" and the bias variable "b" as the critical dimension bias function "$W(b)_{ij}$". In step S24, the bias defining module 310 calculates the residual sum of squares "U(b)" given by the equation (3) by using the actual critical dimension "$CD_{ij}$" stored in the critical dimension memory 336 and the critical dimension bias function "$W(b)_{ij}$" defined in the step S23. In step S25, the bias defining module 310 defines the value of the bias variable "b" that gives the minimum residual sum of squares "U(b)" as the correcting bias "$b_B$" and stores the correcting bias "$b_B$" in the correcting parameter memory 341.

Figure 5:
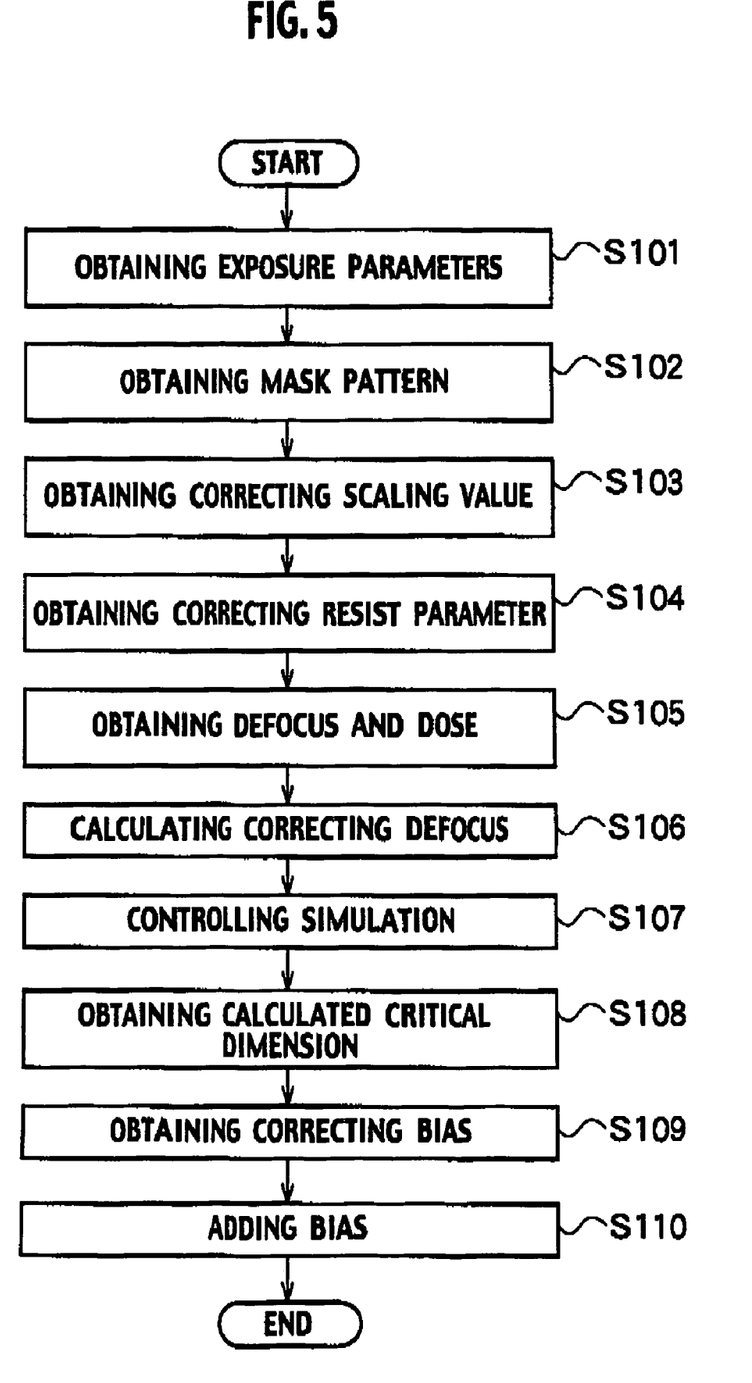
FIG. 5 is a flowchart depicting a simulation method in accordance with the embodiment of the present invention.

With reference next to FIG. 5, a simulation method using the correcting resist parameter, the correcting scaling value "$s_B$", and the correcting bias "$b_B$" is described.

In step S101, the simulator corrector 304 obtains the exposure conditions, such as the NA of the projection optical system 42 shown in FIG. 2, the coherence factor "σ", and the aperture type for annular or quadrupolar illumination. In step S102, the simulator corrector 304 obtains the mask pattern for manufacturing the semiconductor device stored in the mask pattern data memory 340.

In step S103, the simulator corrector 304 obtains the correcting scaling value "$s_B$" stored in the correcting parameter memory 341. In step S104, the simulator corrector 304 obtains the correcting resist parameter stored in the correcting parameter memory 341. In step S105, the simulator corrector 304 selects one of the defocus and dose conditions 6AA-6NN shown in FIG. 3 and stored in the lithography condition memory 338, the selected exposure condition being used for manufacturing the semiconductor device by the exposure tool 3 shown in FIG. 1.

In step S106, the simulator corrector 304 multiplies the defocus "$F_i$" included in the selected exposure condition by the correcting scaling value "$s_B$" to calculate the correcting defocus "$FC_i$". The simulator corrector 304 interchanges the defocus "$F_i$" included in the selected exposure condition with the correcting defocus "$FC_i$". In step S107, the simulator corrector 304 transfers the exposure condition, the mask pattern for manufacturing the semiconductor device, and selected defocus and dose condition including the correcting defocus "$FC_i$" into the model simulation engine 325. Thereafter, the simulator corrector 304 instructs the model simulation engine 325 to simulate the projection of the mask pattern for manufacturing the semiconductor device onto the resist to model the calculated critical dimension of the image of the projected mask pattern for manufacturing the semiconductor device.

In step S108, the bias corrector 305 obtains the calculated critical dimension modeled by the model simulation engine 325. In step S109, the bias corrector 305 reads the correcting bias "$b_B$" from the correcting parameter memory 341. In step S110, the bias corrector 305 corrects the image of the projected mask pattern for manufacturing the semiconductor device by adding the correcting bias "$b_B$" to the calculated critical dimension.

The simulation method described above makes it possible to predict the critical dimension of the image of the projected mask pattern precisely. In earlier simulation methods, simulated profiles do not match the actual critical dimensions. However, the simulation method according to the embodiment of the present invention shown in FIG. 5 uses the correcting resist parameter, the correcting scaling value "$s_B$", and the correcting bias "$b_B$" extracted by the parameter tuning method shown in FIG. 4. The correcting resist parameter, the correcting scaling value "$s_B$", and the correcting bias "$b_B$" are extracted by comparing the simulation result with the actual critical dimensions. Therefore, by using the correcting resist parameter, the correcting scaling value "$s_B$", and the correcting bias "$b_B$", it possible to feed back actual profile in formation to correct the image predicted by the model simulation engine 325 shown in FIG. 1. Consequently, the image corrected by the bias corrector 305 matches an actual result.

In the earlier simulation methods, the accuracy in the focus direction is especially low. However, the simulation method according to the embodiment uses the correcting scaling value "$s_B$". Therefore, the simulation method according to the embodiment increases the accuracy in the focus direction. Also, in the earlier simulation methods, a simulated "pivotal line width" that does not vary under various focus conditions does not match the actual pivotal line width. However the simulation method according to the embodiment adds the correcting bias "$b_B$" to the calculated critical dimension in the step S110 of FIG. 5. Therefore, the simulated pivotal line width matches the actual pivotal line width

OTHER EMBODIMENTS

Although the invention has been described above by reference to the embodiment of the present invention, the present invention is not limited to the embodiment described above. Modifications and variations of the embodiment described above will occur to those skilled in the art, in the light of the above teachings.

For example, the model simulation engine 325 shown in FIG. 1 may employ various lithography simulation programs, such as a simple simulation program to model the critical dimension by convoluting a latent image expressed by a Gaussian function and slicing the convoluted function by a threshold value, and a comprehensive simulation program using various parameters for a latent image, an acid diffusion and reaction in the resist, and the development.

In FIG. 2, a reduction projection system is depicted as the exposure tool 3. However, various printers, such as a contact exposure tool, a proximity exposure tool, and a 1× strip repeat printer, can be used for the exposure tool 3. Also, in the step S10 of FIG. 4., the mask having parallel rectangle transparent patterns is used as an example. However, a mask having various transparent patterns spaced in a predefined relationship also can be used to obtain the correcting resist parameter, the correcting scaling value "$s_B$", and the correcting bias "$b_B$" corresponding to the shape and space of the transparent patterns.

The simulation method according to the embodiment of the present invention is capable of being expressed as descriptions of a series of processing or commands for the simulator. Therefore, the parameter tuning method and the simulation method shown in FIGS. 4 and 5 are capable of being formed as a computer program product to execute multiple functions of the CPU in the simulator. "The computer program product" includes, for example, various writable mediums and storage devices incorporated or connected to the simulator. The writable mediums include a memory device, a magnetic disc, an optical disc and any devices that record computer programs.

As described above, the present invention includes many variations of embodiments. Therefore, the scope of the invention is defined with reference to the following claims.

What is claimed is:

1. A simulator of a lithography tool comprising:
   a correcting parameter memory configured to store a correcting scaling value and a correcting bias, the correcting scaling value being used to correct a focus error of a projection optical system in the lithography tool, the correcting bias being used to correct a critical dimension error generated in the lithography tool;
   a model simulation engine configured to simulate an image formation by the lithography tool, by using a corrected focus, to model a calculated critical dimension of a simulated image, the corrected focus being calculated by multiplying an actual defocus of the projection optical system in the lithography tool by the correcting scaling value, the actual defocus being used to form an actual image by the lithography tool, the actual image corresponding to the simulated image; and
   a bias corrector configured to add the correcting bias to the calculated critical dimension to make the simulated image approximate to the actual image.

2. The simulator of claim 1, further comprising a microscope configured to measure an actual critical dimension of the image generated by the lithography tool.

3. The simulator of claim 2, wherein the model simulation engine models a plurality of focus dependency critical dimensions under a plurality of scaled focuses respectively, the scaled focuses being calculated by multiplying the defocus by a plurality of scaling values.

4. The simulator of claim 3, further comprising a scaling value defining module configured to define one of the scaling values used to model one of the focus dependency critical dimensions approximate to the actual critical dimension as the correcting scaling value.

5. The simulator of claim 2, wherein the model simulation engine models a plurality of resist parameter dependency critical dimensions by using a plurality of resist parameters, respectively.

6. The simulator of claim 5, further comprising a resist parameter defining module configured to define one of the resist parameters used to model one of the resist parameter dependency critical dimensions approximate to the actual critical dimension as a correcting resist parameter used to model the calculated critical dimension.

7. A simulation method, comprising:
obtaining a correcting scaling value used to correct a focus error of a projection optical system in a lithography tool;
obtaining a correcting bias used to correct a critical dimension error generated in the lithography tool;
simulating an image formation by the lithography tool, by using a corrected focus, to model a calculated critical dimension of a simulated image, the corrected focus being calculated by multiplying an actual defocus of the projection optical system in the lithography tool by the correcting scaling value, the actual defocus being used to form an actual image by the lithography tool, the actual image corresponding to the simulated image; and
adding the correcting bias to the calculated critical dimension to make the simulated image approximate to the actual image.

8. The method of claim 7, wherein obtaining the correcting scaling value further comprises:
measuring an actual critical dimension of the image generated by the lithography tool;
modeling a plurality of focus dependency critical dimensions under a plurality of scaled focuses, respectively, the scaled focuses being calculated by multiplying the defocus by a plurality of scaling values; and
defining one of the scaling values used to model one of the focus dependency critical dimensions approximate to the actual critical dimension as the correcting scaling value.

9. The method of claim 8, wherein defining the correcting scaling value further comprises calculating a residual sum of squares of the actual critical dimension and each of the focus dependency critical dimensions.

10. The method of claim 8, wherein obtaining the correcting bias further comprises:
defining a critical dimension bias function expressed by a sum of one of the focus dependency critical dimensions and a bias variable;
calculating a residual sum of squares of the actual critical dimension and the critical dimension bias function; and
determining a value of the bias variable giving the minimum of the residual sum of squares.

11. The method of claim 7, further comprising obtaining a correcting resist parameter to correct a resist parameter dependency error generated in the lithography tool.

12. The method of claim 11, wherein obtaining the correcting resist parameter further comprises:
measuring an actual critical dimension of the image generated by the lithography tool;
modeling a plurality of resist parameter dependency critical dimensions by using a plurality of resist parameters, respectively; and
defining one of the resist parameters used to model one of the resist parameter dependency critical dimensions approximate to the actual critical dimension as the correcting resist parameter.

13. The method of claim 12, wherein defining the correcting resist parameter further comprises calculating a residual sum of squares of the actual critical dimension and each of the resist parameter dependency critical dimensions.

14. A computer-readable medium for storing a computer program for a simulator, the computer program comprising:
instructions configured to obtain a correcting scaling value within the simulator, the correcting scaling value being used to correct a focus error of a projection optical system in a lithography tool;
instructions configured to obtain a correcting bias within the simulator, the correcting bias being used to correct a critical dimension error generated in the lithography tool;
instructions configured to simulate an image formation by the lithography tool, by using a corrected focus, to model a calculated critical dimension of a simulated image within the simulator, the corrected focus being calculated by multiplying an actual defocus of the projection optical system in the lithography tool by the correcting scaling value, the actual defocus being used to form an actual image by the lithography tool, the actual image corresponding to the simulated image; and
instructions configured to add the correcting bias to the calculated critical dimension to make the simulated image approximate to the actual image within the simulator.

15. The computer-readable medium for storing the computer program of claim 14, wherein the instructions configured to obtain the correcting scaling value further comprise:
instructions configured to measure an actual critical dimension of the image generated by the lithography tool within the simulator;
instructions configured to model a plurality of focus dependency critical dimensions under a plurality of scaled focuses, respectively, within the simulator, the scaled focuses being calculated by multiplying the defocus by a plurality of scaling values; and
instructions configured to define one of the scaling values used to model one of the focus dependency critical dimensions approximate to the actual critical dimension as the correcting scaling value within the simulator.

16. The computer-readable medium for storing the computer program of claim 15, wherein the instructions configured to define the correcting scaling value further comprise instructions configured to calculate a residual sum of squares of the actual critical dimension and each of the focus dependency critical dimensions within the simulator.

17. The computer-readable medium for storing the computer program of claim 15, wherein the instructions configured to obtain the correcting bias further comprise:
instructions configured to define a critical dimension bias function expressed by a sum of one of the focus dependency critical dimensions and a bias variable within the simulator;
instructions configured to calculate a residual sum of squares of the actual critical dimension and the critical dimension bias function within the simulator; and
instructions configured to determine a value of the bias variable giving the minimum of the residual sum of squares within the simulator.

18. The computer-readable medium for storing the computer program of claim 15, further comprising instructions configured to obtain a correcting resist parameter to correct a resist parameter dependency error generated in the lithography tool within the simulator.

19. The computer-readable medium for storing the computer program of claim 18, wherein the instructions configured to obtain the correcting resist parameter further comprise:

instructions configured to measure an actual critical dimension of the image generated by the lithography tool within the simulator;

instructions configured to model a plurality of resist parameter dependency critical dimensions by using a plurality of resist parameters, respectively, within the simulator; and instructions configured to define one of the resist parameters used to model one of the resist parameter dependency critical dimensions approximate to the actual critical dimension as the correcting resist parameter within the simulator.

20. The computer-readable medium for storing the computer program of claim 19, wherein the instructions configured to define the correcting resist parameter further comprise instructions configured to calculate a residual sum of squares of the actual critical dimension and each of the resist parameter dependency critical dimensions within the simulator.

* * * * *